United States Patent [19]

Houston

[11] Patent Number: 5,018,102

[45] Date of Patent: May 21, 1991

[54] MEMORY HAVING SELECTED STATE ON POWER-UP

[75] Inventor: Theodore W. Houston, Richardson, Tex.

[73] Assignee: Texas Instruments, Incorporated, Dallas, Tex.

[21] Appl. No.: 287,338

[22] Filed: Dec. 20, 1988

[51] Int. Cl.⁵ .............................................. G11C 13/00
[52] U.S. Cl. ........................................ 365/95; 365/154
[58] Field of Search ........................... 365/95, 94, 154

[56] References Cited

U.S. PATENT DOCUMENTS 4,224,686 9/1980 Aneshansley .......................... 365/95

*Primary Examiner*—Terrell W. Fears

*Attorney, Agent, or Firm*—James T. Comfort; Melvin Sharp; Stanton C. Braden

[57] ABSTRACT

A memory cell which includes a pair of cross-coupled CMOS inverters. Each inverter has a capacitor coupled from its output to either the supply voltage or ground potential. One inverter has a capacitor coupled from its output to a voltage supply terminal and the other inverter has a capacitor coupled from its output to a ground terminal. Upon the application of power to the memory cell, the output of each inverter of the pair assumes a predetermined logic state thereby preventing dc current flow in either side of the cross coupled pair. In addition to providing for reduced power consumption, the selective cell assymetry provided makes possible a random access memory device that stores a fixed program at power up.

9 Claims, 4 Drawing Sheets

MEMORY HAVING SELECTED STATE ON POWER-UP

BACKGROUND OF THE INVENTION

The present invention relates to electronic semiconductor devices and methods of fabrication, and more specifically, to semiconductor memory devices such as static random access memories.

Static random access memories (SRAMS) having memory cells which incorporate two conventional cross-coupled CMOS inverters are particularly useful in applications such as communication satellites where minimal power consumption is a requirement. As will be described more fully below, the power saving advantage of this cell is frequently diminished by a period of high current drain upon the application of power to the memory circuit.

An understanding of the structure and operation of a static memory cell which may exhibit increased power consumption during power-up is best described with reference to FIG. 1 which illustrates a schematic drawing of a conventional CMOS (complementary metal oxide semiconductor) static memory cell as typically used in a static random access memory (SRAM). Memory cell 2 is constructed using well known methods of cross-coupled CMOS inverter fabrication (see, for example, Muller and Kamins, "Device Electronics for Integrated Circuits", Second Edition, 1986, pp. 449-467). A first CMOS inverter 4 in memory cell 2 is comprised of P-channel transistor 6 and N-channel transistor 8 each having source-to-drain paths which are connected in series between a source of supply voltage Vcc and a reference node such as ground. The gate electrodes of transistors 6 and 8 are connected in common. The second CMOS inverter 5 in memory cell 2 is similarily constructed, with P-channel transistor 10 and N-channel transistor 12 each having source-to-drain paths which are connected in series between Vcc and ground. The gate electrodes of transistors 10 and 12 are also connected in common. The cross-coupling connections are accomplished by connecting the gate electrodes of transistor 6 and 8 to the drains of transistors 10 and 12 (node S2), and by connecting the gate electrodes of transistors 10 and 12 to the drains of transistors 6 and 8 (node S1). N-channel pass transistor 14 has a source-to-drain path coupled between node S1 and a first bit line BL and pass transistor 16 has a source-to-drain path coupled between node S2 and a second bit lin BL . The gate electrodes of both transistors 14 and 16 are connected to a word line WL. Pass transistors 14 and 16, when enabled, allow data to transfer into and out of the memory cell 2 from bit lines BL and BL. respectively. Pass transistors 14 and 16 are enabled by a signal on word line WL which is provided by decoding a row address applied to the SRAM and decoded by a row decoder in the SRAM (not shown). The decode function enables one out of n word lines where n is the number of rows of memory cells in the SRAM.

In operation, the stable state voltages on nodes S1 and S2 will necessarily be the logical complements of one another as a result of the cross-coupled configuration of inverters 4 and 5. When pass transistors 14 and 16 turn on by application of an appropriate signal to word line WL, nodes S1 and S2 are respectively coupled to bit lines BL and BL.. Accordingly, the state of the cell may be determined by enabling word line WL to establish a voltage differential between bit lines BL and BL. which may be appropriately sensed in a read operation. Alternatively, peripheral circuitry may be activated to impress a voltage on BL and BL. and alter the state of memory cell 2 to effect a write operation. The sizes of the transistors shown FIG. 1 are typically selected such that when pass transistors 14 and 16 are turned on by word line WL, a differentially low voltage at bit line BL with respect to bit line BL can force node S2 to a logic low level. However, the sizes of the transistors shown in Figure are also chosen such that when transistors 14 and 16 are on, a differentially high voltage at bit line BL with respect to bit line BL. will not force node S1 high. In addition, a differentially high voltage at bit line BL. with respect to bit line BL will not force node S2 high. As a result, writing to the memory cell is accomplished by forcing the desired bit line and the desired side of cell 2 at either node S1 or S2 to a logic low, which in turn causes the opposite side of cell 2 to have a logic high state.

As mentioned previously, an advantage of the above cell arrangement is low power consumption. In a stable state, nodes S1 and S2 remain at full and opposite logic levels. In this quiescent condition, one of the two transistors in each inverter 4 and 5 is non-conducting and there is no direct current path from the supply voltage except for perhaps junction leakages.

It has been observed, however, that upon the application of power to the memory circuit, it is possible for the CMOS memory cell of the type shown in FIG. 1 to experience a balanced condition in which the voltage at nodes S1 and S2 may be about equal and at a level that is between that of Vcc and ground. Under these conditions, the memory cell will experience high current conduction and unwanted power consumption as both the P-channel and the N-channel transistors of inverters 4 and 5 simultaneously conduct.

Static memory cells of the type described and operating in certain environments in which radiation is present such as communication satellite orbital space are particularly vulnerable to soft error mechanisms such as gamma dot or SEU (single event upset). Numerous methods have been proposed for reducing susceptibility to these mechanisms including the circuit of FIG. 2 which incorporates two depletion mode P-channel devices 18 and 20 in the cross-couple path of a device like that shown in FIG. 1 (See, for example, copending application Ser. No. 252,291, filed Sept. 30, 1988, assigned to Texas Instruments Incorporated Transistors 18 and 20 serve to inhibit nodes S2 and S1 from going to a high voltage from a low voltage in response to pulsed transient dose radiation by adding resistance to the cross-couple path and increasing the RC time constant delay. Upon the application of power to this circuit arrangement, the added delay will tend to increase the period of balanced operation resulting in increased dc current drain and power consumption.

Finally, at the system level, it is frequently useful to incorporate a memory device that provides a predetermined data pattern at the time power is applied to the system. A typical example of this is the storage of a "bootstrap program" which is a program executed automatically when, for example, a computer system is switched on. In the past, this is usually accomplished by providing a nonvolatile memory such as a ROM (read only memory such as PROM, EPROM, or EEPROM) which has been previously programmed and will not lose the program data when power to the system is interrupted. Such devices may be costly and, more importantly, may not be used for random memory purposes since the data sorted in these devices is intended to remain fixed during system operation.

Accordingly, it would be desirable to provide a memory cell that avoids the problem of increased power consumption upon application of power to the memory circuit. It would also be desirable to provide a memory device that may be configured to provide a predetermined data pattern (which may include resetting all memory cells to the same logic state) upon the application of power yet operate as a random access memory during normal system operation. It is therefore an object of the invention to provide a new and improved memory cell which may be incorporated into a high density integrated circuit. It is another object of the invention to provide a memory cell that exhibits reduced power consumption. It is yet a further object of the invention to provide a random access memory device that provides a fixed data pattern upon the application of power to the device. It is still a further object of the invention to provide a random access memory device that clears or resets upon the application of power to the device.

SUMMARY OF THE INVENTION

In accordance with one embodiment of the invention there is provided a low power semiconductor random access memory cell that includes a pair of cross-coupled CMOS inverters. The memory cell further includes at least one capacitor which is coupled from the output of one inverter to either the supply voltage or ground nodes to provide asymmetrical capacitance at the outputs of the inverter pair and force the memory cell to a predetermined logic state upon the application of power. Two separate capacitors having different values of capacitance may be provided to couple one inverter output to the supply voltage (Vcc) and the opposite inverter output to ground potential (Vss). By assuming a predetermined logic state during power up, the asymmetrical cell avoids significant dc current drain which is present in balanced cells that exhibit conduction through both inverters for some period of time. In addition, the asymmetrical memory cell is suitable for use in a memory device providing a fixed data pattern at power up which may thereafter be modified in normal random access fashion. Moreover, the asymmetrical memory cell may be used in a memory device to provide a means of rapidly resetting an array of cells.

In another embodiment of the invention, the supply voltage provided to each of the inverters in the cross-coupled pair may be staggered in time after power up to ensure that the memory cell assumes the desired logic state. In this configuration, each inverter in the cross-coupled cell is connected to a separate supply bus to again ensure that the cell assumes a quiescent state and does not conduct excessive current.

DESCRIPTION OF THE PREFERRED EMBODIMENT

Figure 1:
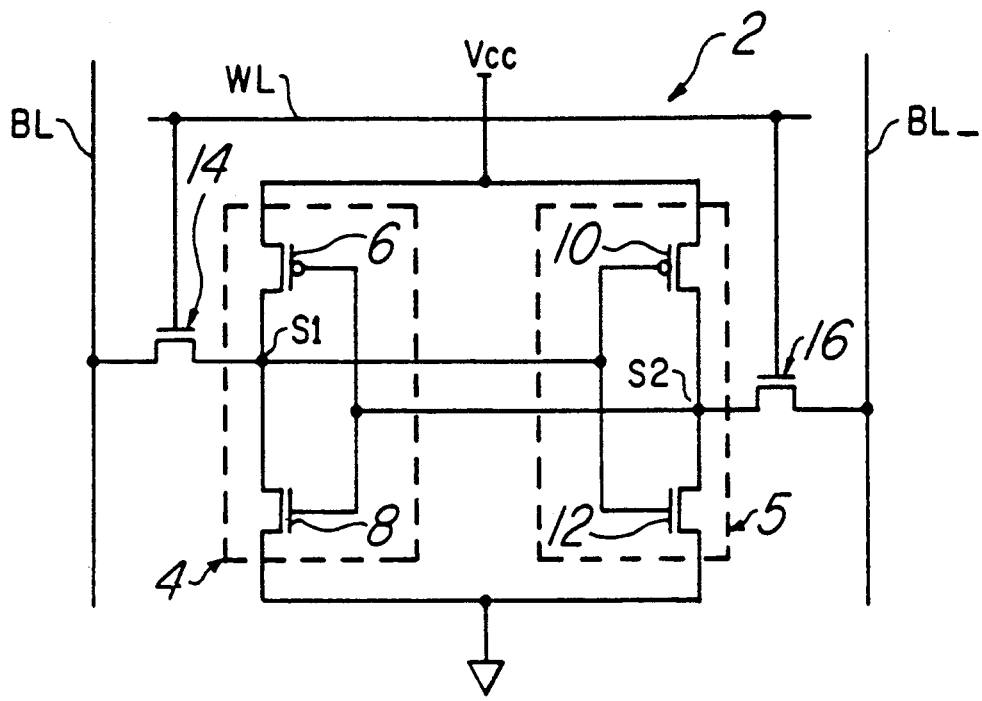
FIG. 1 is a schematic drawing of a convention CMOS static memory cell.

A preferred embodiment of the present invention will be described with reference to the drawing of FIG. 3 which shows a CMOS static memory cell having some of the features of the memory cell as described above with reference to FIG. 1. The elements that are common to both the cells of FIGS. 1 and 3 bear the same designation. It should be understood that a semiconductor integrated circuit memory made in accordance with this invention employs a plurality of such cells together with peripheral circuits for writing data into memory and for accessing the data stored in the memory. For simplicity, these circuits are not shown.

Figure 3:
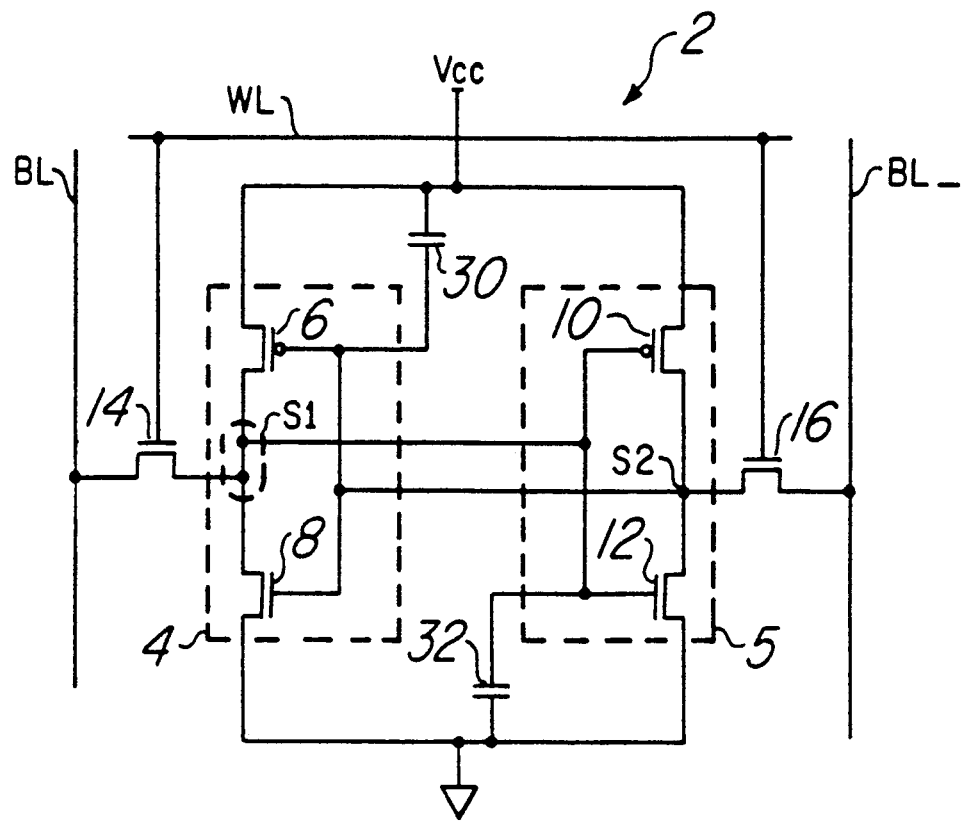
FIGS. 3 and 4 are schematic drawings of the memory cell of the preferred embodiment.

The static memory cell 2 shown in FIG. 3 includes two CMOS inverters 4 and 5 which are arranged in a cross-coupled configuration as previously described with regard to FIG. 1. Inverter 4 includes a P-channel load transistor 6 and an N-channel driver transistor 8 each having source to drain paths which are coupled in series between a source of supplyvoltage Vcc and a reference node such as ground. The gate electrodes of transistors 6 and 8 are connected in common. A second inverter 5 is constructed in the same manner. That is, P-channel load transistor 10 and N-channel driver transistor 12 each have source to drain paths which are coupled in series between supply voltage Vcc and ground. The gate electrodes of transistors 10 and 12 are also connected in common. The cross-couple arrangement is effected by connecting the gates of transistors 6 and 8 to the drains of transistors 10 and 12 (node S2) and connecting the gates of transistors 10 and 12 to the drains of transistors 6 and 8 (node S1). Two N-channel pass transistors 14 and 16 are provided to couple the bit lines or column lines BL and BL. to nodes S1 and S2 respectively. Transistor 14 has a gate electrode connected to word line WL, and a source to drain path between bit line BL and node S1. Transistor 16 has a gate electrode connected to word line WL and a source to drain path between bit line BL and node S2.

Still referring to FIG. 3, the memory cell 2 is shown to include a capacitor 30 connected between the source of supply voltage Vcc and the gate electrodes of transistors 6 and 8. In addition, a second capacitor 32 is connected between the ground reference node and the gate electrodes of transistors 10 and 12. Capacitors 30 and 32 will provide the desired asymmetrical coupling of the nodes S1 and S2 to Vcc and ground to force memory cell 2 into a predetermined logic state when power is applied to the device. It should be noted that the desired coupling of nodes S1 and S2 to either Vcc or ground may be accomplished in a number of ways and using a variety of process and/or cell layout techniques as will be described.

In operation, the memory cell 2 of FIG. 3 will always assume the same logic state when supply voltage Vcc is provided to power up the memory device. At that time, word line WL will not have been selected and transistors 14 and 16 will typically be in the off state isolating bit lines BL and BL. from nodes S1 and S2 respectively. As previously mentioned, the pass transistors 14 and 16 will typically be in the off state during power up. It is possible however that voltage transients effecting the word line during device turn-on may result in these transistors (14 and 16) turning on for a short period of time which would couple bit lines BL and BL. to nodes S1 and S2 respectively. Under these conditions, the memory cell may not assume the desired state if the bit line logic level coupled to a given node (S1 or S2) is opposite that desired. In the case where it is desired that an array of memory cells assume the same logical state (all 0's or 1's), the cells could be arranged to exhibit asymmetry in the capacitance from bit lines BL and BL. to either the supply voltage (Vcc) or ground to reinforce the action of capacitors 30 and 32. This would typically be accomplished by selectively modifying the small amount of parasitic capacitance on the desired bit line during device layout using techniques known in the art. The added capacitor 30 will rapidly couple Vcc to the gate electrodes of P-channel transistor 6 and N-channel transistor 8 turning transistor 8 on and turning transistor 6 off. Accordingly, node S1 will be coupled to ground through conducting transistor 8 and will assume a logic low condition. The low level at node S1 is also provided to the gates of P-channel transistor 10 and N-channel transistor 12 which turns transistor 12 off and transistor 10 on to couple node S2 to Vcc or a logic high state. IN a like manner, capacitor 32 is provided to couple the gate electrodes of P-channel transistor 10 and N-channel transistor 12 to ground which reinforces the same logic state for cell 2. That is, the gates of transistors 10 and 12 will be held in a low state to keep node S1 low and S2 high through the conduction of P-channel transistor 10. As a result, memory cell 2 will always assume the above described logic state when power is applied. This quiescent state is rapidly accomplished and, since one of the two transistors in each inverter 4 and 5 remains non-conducting, a direct path of current flow from Vcc to ground is prevented and power consumption is reduced. If it is desired that the memory cell 2 assume the opposite logic state upon power up, capacitor 30 may be replaced with a capacitor from the gate electrodes of transistors 6 and 8 to ground and capacitor 32 may be replaced with a capacitor from the gates electrodes of transistors 10 and 12 to Vcc. In this case, operation will be as before except that node S1 will assume a high state and node S2 will assume a logic low state.

The memory cell 2 of FIG. 3 will operate in the normal manner when it is desired to write or read data to and from the cell. In other words, the logic state assumed by the cell upon power up as described above may be modified by writing new data into the cell as discussed with reference to the conventional cell of FIG. 1. For example, assume that after power up it is desired to write a logic 1 (high level) to node S1. Word line WL will be selected to enable transistor 14 and 16 to couple nodes S1 and S2 to bit line BL and BL. respectively. As described previously, bit line BL. will be forced to a logic low state which in turn will turn on transistor 6 and disable transistor 8 to couple node S1 to Vcc and isolate it from ground. Capacitors 30 and 32 will not effect the new quiescent state of the memory cell.

While the above described configuration is a preferred way of accomplishing the low power asymmetrical cell of the present invention, it is possible to effect the desired asymmetry by providing only one of the capacitors 30 or 31 to the desired node. For example, assume that it is desirable to have a given memory cell assume a logic state at power up wherein node S1 is low and node S2 is high. This may be conveniently accomplished by providing a single capacitor between supply voltage terminal Vcc and the gates electrodes of transistors 6 and 8. As before, at turn on Vcc will be rapidly coupled to the gates of transistors 6 and 8 turning P-channel transistor 6 off and turning N-channel transistor 8 on. Node S1 will be coupled to ground or a low potential which will, through the action of the cross couple, force node S2 in inverter 5 to a logic high level.

The formation of capacitors 30 and 32 may be readily implemented in a variety of ways. For example, assume that either the supply voltage terminal (Vcc) or ground bus (reference terminal) is routed to the memory cell array in a conductive interconnect layer (e.g. metal) which is formed at a level above that of the material (e.g. polysilicon) forming the gate electrodes of transistors 6 and 8. The capacitor 30 of FIG. 3 may be formed by patterning and etching the conductive Vcc layer to have increased area over the gate electrodes of transistors 6 and 8 as compared to that over the gate electrodes of transistors 10 and 12. In this example, the Vcc layer forms one plate of the capacitor and the gate electrode layer forms the other plate. In the same manner, the capacitor 32 of FIG. 3 may be formed by patterning and etching the ground bus conductive layer to include increased area over the gate electrodes of transistors 10 and 12. Similarly, the supply voltage or ground bus conductive layer may be patterned and etched to asymmetrically overlap the diffused drain regions which form nodes S1 and S2 to, for example, couple node S2 to ground through capacitor 32 and node S1 to Vcc through capacitor 30. Yet another way of forming the asymmetrical capacitance would be to pattern and etch the gate electrodes of transistors 6 and 8 to have increased area under the Vcc bus to form capacitor 30 and patterning the gate electrodes of transistors 10 and 12 to have increased area under the ground bus to form capacitor 32.

In addition to the layout options described above, the desired asymmetrical capacitance may be formed by selectively thinning the insulating layer under the Vcc and/or ground busses. It is well known that thinning the dielectric material between two conductive plates increases the plate to plate capacitance. Using this concept, capacitor 30 of FIg. 3 may be formed, for example, by reducing the thickness of the insulator between the Vcc bus (e.g. metal) and the conductive layer that forms the gate electrodes of transistors 6 and 8 relative to the thickness between the bus and gate electrode layer for transistors 10 and 12. Capacitor 32 may be formed in a similar manner using the ground bus layer and metal and gate electrode layer of transistors 10 and 12 as the capacitor plates. While several methods for fabricating the capacitors have been described, other methods may occur to those skilled in the art without departing from the spirit and scope of the invention.

Figure 2:
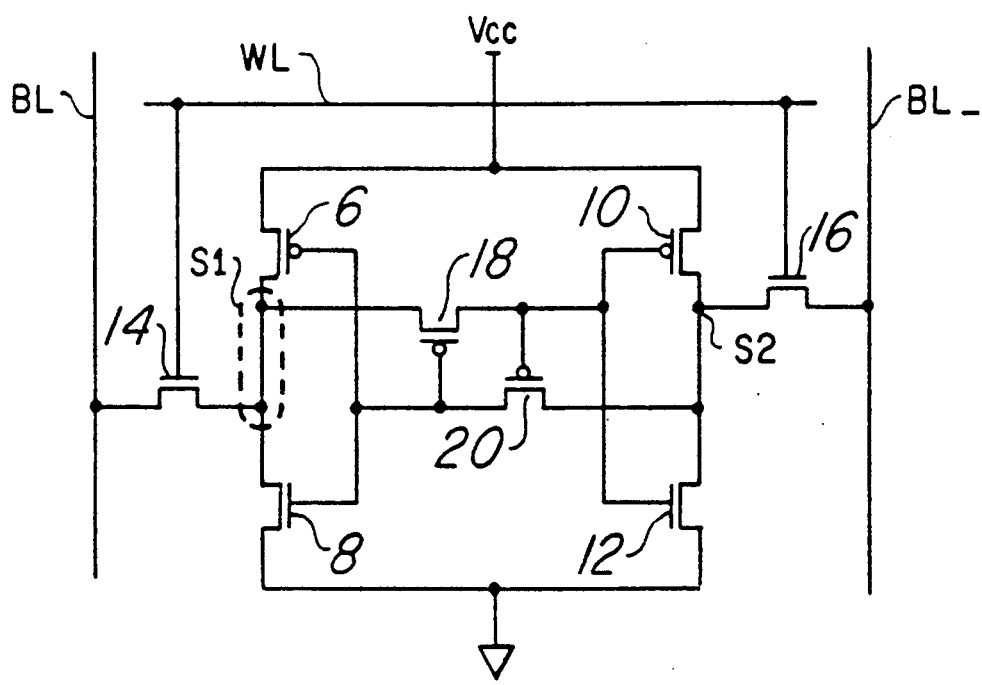
FIG. 2 is a schematic drawing of a CMOS static memory cell having improved resistance to short pulsed transient dose radiation.
Figure 4:
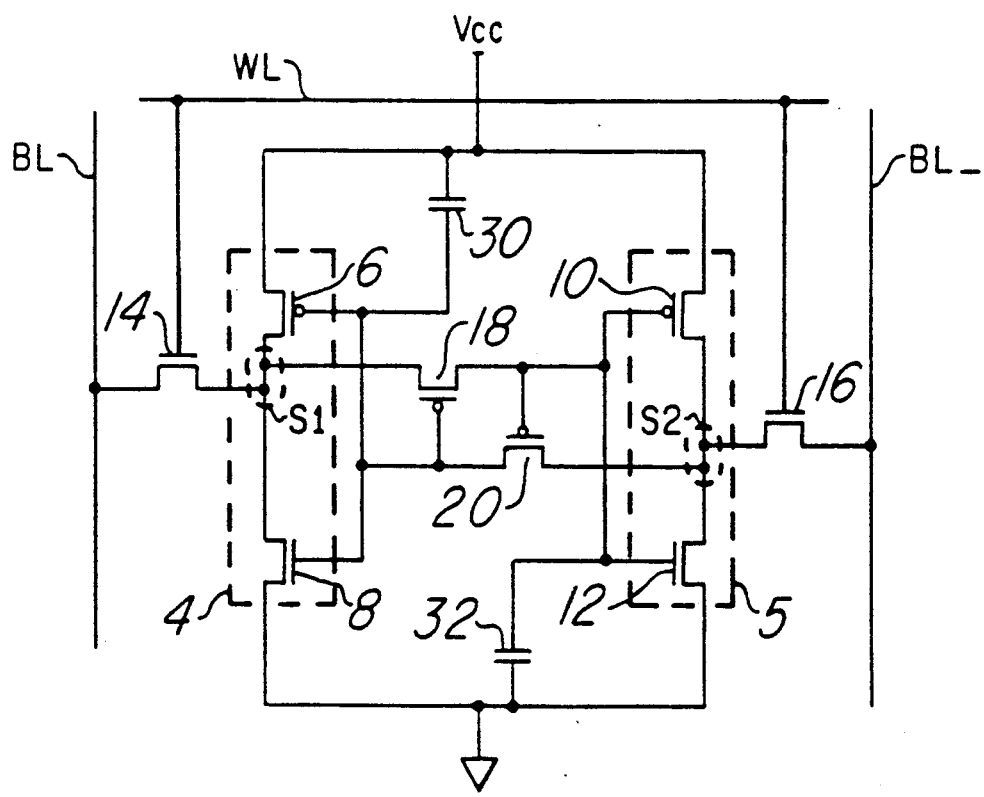

Turning next to FIG. 4, there is shown the radiation hardened memory cell of FIG. 2 including the asymmetrical capacitor arrangement of the present invention. As mentioned previously, the P-channel transistors 18 and 20 serve to add resistance to the cross-couple path to increase the RC time constant delay and reduce the sensitivity to transient dose radiation. The addition of these devices, while significantly improving the soft error performance of the cell operating in a radiation environment, aggravates the power consumption problem discussed herein above by slowing the transition from a balanced state where both inverters 4 and 5 are conducting current from Vcc to ground to a quiescent low power state. The addition of capacitor 30 between Vcc and the gate electrodes of transistors 6 and 8 as well as capacitor 32 between the ground and the gate electrodes of transistors 10 and 12 will overcome the power up current drain problem and provide an optimal memory cell design for low power, radiation environment applications. Operation of the cell shown in FIG. 4 is as described for the cell of FIG. 3 and the variations in circuit implementation are equally applicable to the circuit of FIG. 4.

Figure 5:
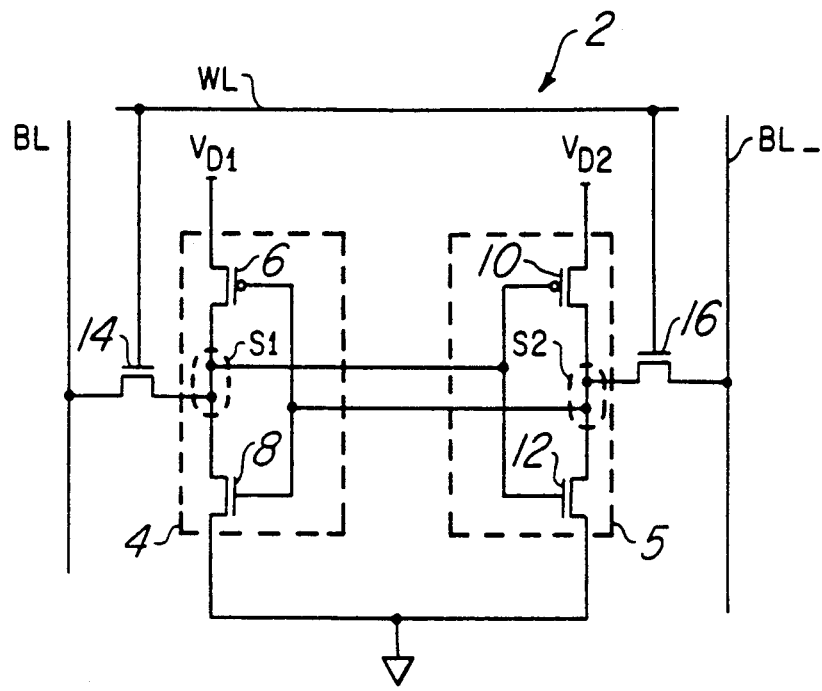
FIG. 5 is a schematic drawing of an alternative memory cell embodiment.

With reference to FIG. 5, there is shown yet another embodiment of the invention. The schematic of FIG. 5 illustrates a memory cell having the elements of the cell as shown in FIG. 1 but including separate connections to the sources of P-channel transistor load devices 6 and 10. That is, the P-channel load transistor 6 has its source connected to a power supply bus VD1 and the P-channel load device 10 has its source connected to power supply bus VD2. In other resets, the elements of memory cell 2 are connected as shown in FIG. 1 and described above. The supply busses VD1 and VD2 may be conveniently provided by routing two separate lines to the memory cells in the cell array.

The memory cell may be forced into a desired state when the memory device is powered up by providing a time delay between the application of voltage to VD1 and VD2 busses. This may be conveniently accomplished by delay circuitry which operates to switch the external supply voltage to one of the two busses VD1 or VD2 after the supply voltage has been applied to the other bus. Since the inverter 4 or 5 which has its supply voltage delayed will draw very little current as will be seen, the external supply may be switched through a transistor to provide the delayed application to one of the two supply busses (VD1 and VD2). A less desirable technique would be to include a resistor between the external supply and the supply bus (VD1 or VD2) that is to receive the delayed voltage.

In operation, the memory cell 2 of FIG. 5 will assume a predetermined logic state upon the application of power to the cell which depends upon the delay between the voltages applied to VD1 and VD2. Assuming that, upon power up, positive voltage is initially applied to the VD1 bus only. This high voltage couples through P-channel transistor 6 to node S1 and the gates of transistors 10 and 12 which in turn enables N-channel transistor 12 forcing node S2 to ground or a logic low condition. Voltage is applied to VD2 a short time after the VD1 bus is activated to provide a voltage source to the source of P-channel transistor 10. Transistor 10 will have a high voltage on its gate electrode and will remain off so very little current is required from the VD2 supply bus as mentioned previously. The logic low state of node S2 and therefore the gate electrodes of transistors 6 and 8 will keep transistor 8 off, transistor 6 on, and node S1 will remain at a logic high level. As before, by switching the memory cell 2 to a predetermined logic state upon power up, a quiescent operating state is rapidly achieved and power consumption is reduced.

An alternative way of accomplishing the above described switching would be to couple separate reference terminals to the sources of transistors 8 and 12 and delay the application of ground potential to one of the terminals with respect to the other.

Figure 6:
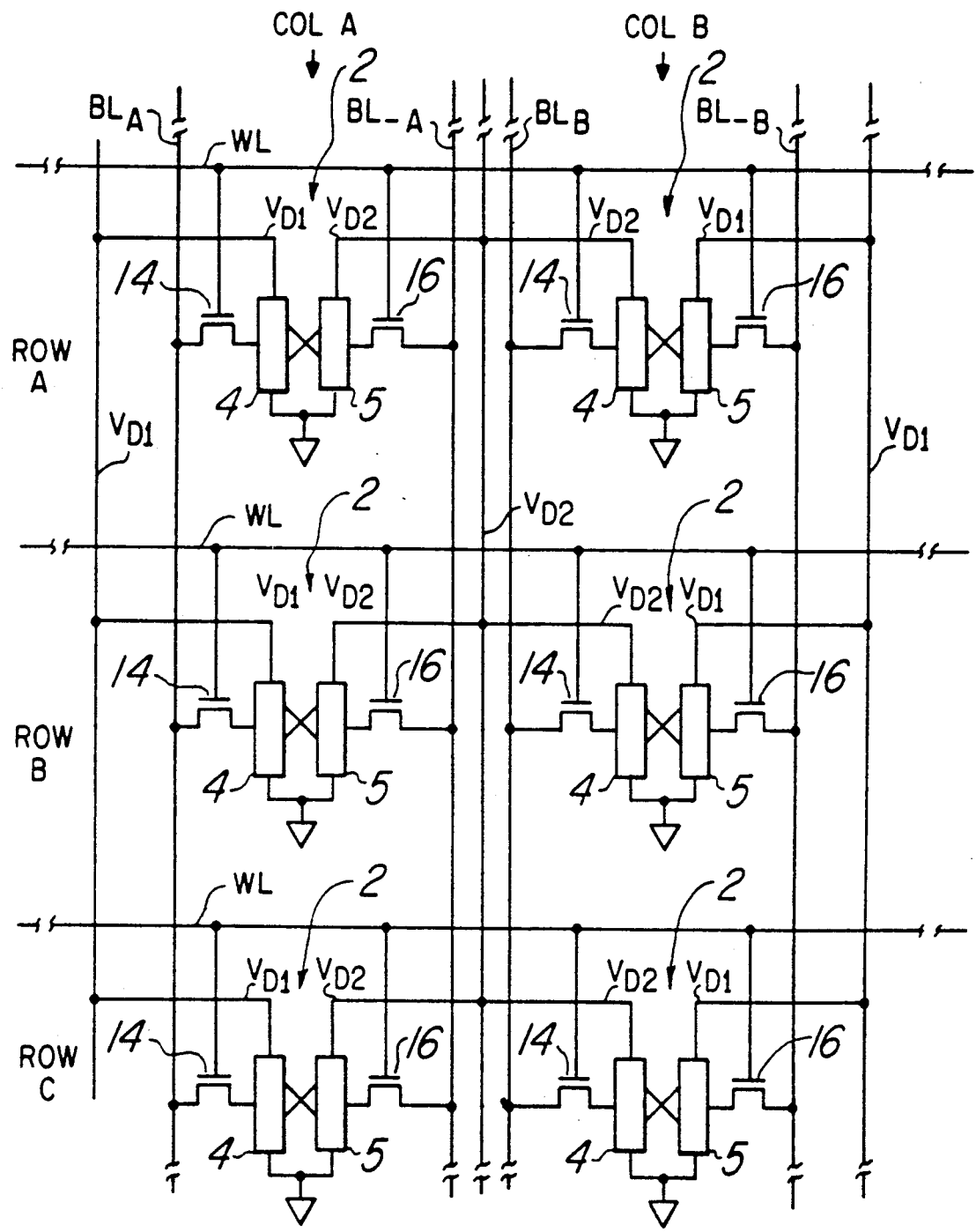
FIG. 6 is a schematic drawing of a memory cell array which incorporates the memory cell of the invention.

FIG. 6 illustrates an array of memory cells 2 of the type shown in FIg. 5. Each cell includes the two cross-coupled inverters 4 and 5 as well as transistors 14 and 1 which couple the bit lines (or column lines ) BL and BL. to the inverters. The cells are arranged in the columns A and B in such a manner that a single voltage supply bus VD2 may serve one inverter 5 in each memory cell 2 of the column A and one inverter 4 in each memory cell of column B. In a like manner, a single supply bus VD1 will be routed to one inverter in each of the cells of two adjacent columns. The VD1 and VD2 buses alternate throughout the array as shown. THis arrangement has the advantage of reducing the number of contacts required and circuit area is also reduced. The manner of connecting a given memory cell to VD1 or VD2 will determine which side of a selected cell and therefore which bit line of the pair BL/BL. is at a high or a voltage level. On the other hand, the manner in which the columns of cells are connected to the I/O circuitry (not shown) will determine whether a "high" or "low" voltage is interpreted as a logic "1" or a logic "0".

In addition to providing a significant reduction in power consumption, the memory cell of the present invention has the advantage of permitting an array of cells to be programmed in a predetermined pattern. This may be advantageous where it is desirable to have a rapid method of resetting a memory array to a given logical state. For instance, it may be desirable to have the memory cleared by resetting each cell in the array to a logical "0 " condition. Moreover, a significant application for a memory device incorporating the cell of the invention is the nonvolatile storage of a program or data pattern which is available at power-up to initiate a system such as a computer system. The memory device so configured would thereafter be available during normal system operation as a random access memory device.

Figure 7:
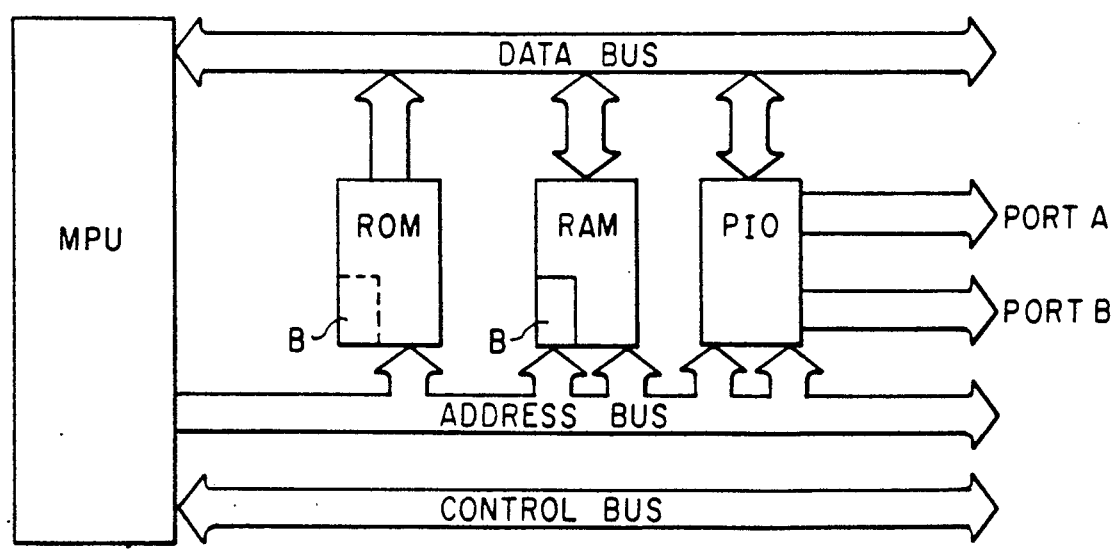
FIG. 7 is a lock diagram showing a system which includes a memory device having the memory cell of the invention.

Referring to FIg. 7, there is shown a simplified block diagram of a computer system which may use the memory cell of the present invention to implement a device for storing a "bootstrap program " or a program for initiating system operation upon the application of power. The system includes a microprocessor unit MPU, read only memory ROM, random access memory RAM and one or more interface circuits designated PIO for parallel input output. As mentioned before the ROM is nonvolatile memory and is ideal for storing the system program since its contents will not be lost when the system is turned off. It is typical that a portion of ROM be dedicated to the bootstrap program shown by the region outlined by the dashed lines and designated B in the ROM block of FIG. 6. Bootstrap programs, and their implementation in ROM are well known (see for example, Rodnay Zaks, "Programming the Z80", 1979, p.48). In accordance with the present invention, it is now possible to implement the bootstrap program in a portion of RAM illustrated as region B in the RAM block of FIG. 6. The necessary RAM space would be pre-programmed with memory arrays incorporating the techniques of the invention as described above. Upon the application of power to the system, the RMA would then provide the bootstrap program which would be loaded and executed by the MPU to initialize the system. This would advantageously free up the ROM space shown by B in the ROM. As discussed above, the RAM space used to store the bootstrap program could be used in the usual manner during normal system operation only to be available again to "boot" or initialize the system when power is reapplied after interruption.

It should now be clear that the invention described in detail herein provides a versatile bistable circuit element that is asymmetrically configured to provide a predetermined switched logic state when powered up. Such a circuit element (including for example flip flops or latches) may find a variety of applications beyond that of memory array architectures.

Although the invention has been described in detail herein with reference to its preferred embodiment and certain described alternatives, it is to be understood that this description is by way of example only and it is not to be construed in a limiting sense. It is to be further understood that numerous changes in the details of the embodiments of the invention, and additional embodiments of the invention, will be apparent to persons of ordinary skill in the art having reference to this description. For example, the circuits of the invention may be implemented in a cross-coupled inverter cell which employs inverters of a variety other than the CMOS inverter illustrated in the foregoing drawings. One example of such a cross-coupled inverter cell may be an N-channel inverter of the type shown in U.S. Pat. No. 4,110,776, assigned to Texas Instruments Inc. It is contemplated that all such changes and additional embodiments are within the spirit and true scope of the invention as claimed below.

We claim:

1. An integrated circuit including a bistable circuit element comprising at least one coupling device operable to initiate asymmetrical current flow upon the application of a power supply voltage to a supply terminal in the element, operable in two stable states such that asymmetry in current flowing through separate portions of the element is necessary to switch the element from one stable state to another stable state, said separate portions comprising first and second inverters both coupled between said supply terminal and a ground terminal, said first control terminal including a first output node and a first control terminal, said second inverter including both a second output node coupled to said first control terminal and a second control terminal coupled to said first output node, said at least one coupling device being coupled between said supply terminal and said first control terminal to switch the circuit element to a predetermined state upon the application of the power supply voltage to said supply terminal.

2. A bistable circuit element as recited in claim 1 wherein said element further comprises a second coupling device coupled between said ground terminal and said second control terminal.

3. A bistable circuit element as recited in claim 2 wherein said at least one coupling device and said second coupling device are capacitors.

4. A bistable circuit element as recited in claim 1 wherein said element further comprises:
a first transistor having a source to drain path coupled between said first output node and said second control terminal, and a first gate electrode coupled to said first control terminal; and
a second transistor having a source to drain path coupled between said second output node and said first control terminal, and a second gate electrode coupled to said second control terminal, said first and second transistors providing increased resistance to inhibit the switching of said element in the presence of radiation.

5. A bistable circuit element as recited in claim 1 wherein said first and second inverters are CMOS inverters each including a P-channel load transistor and an N-channel driver transistor, the transistors both having source to drain paths coupled in series between said supply terminal and said ground terminal.

6. A bistable circuit element as recited in claim 1 wherein said first and second inverters include a resistive load device and an N-channel driver transistor having a source to drain path coupled in series with said load device between said supply terminal and said ground terminal.

7. A bistable circuit element as recited in claim 1 which further comprises two pass transistors each coupled between the output of an associated inverter and a separate bit line.

8. A bistable circuit element as recited in claim 1 wherein said first and second control terminals comprise first and second separate portions of a first conductive layer, and said supply terminal comprises another conductive layer having selected portions which overlay said first portion by a greater amount than that of said second portion to form said at least one coupling device.

9. A bistable circuit element as recited in claim 1 wherein said first and second control terminals comprise first and second separate portions of a first conductive layer and said supply terminal comprises another conductive layer overlying and insulated from each of the said first and second separate portions by first and second regions of an insulating layer, said at least one coupling device including a capacitor having separate plates comprising said first portion and said another conductive layer, and a dielectric comprising said first region, said first region being thinner than said second region.

* * * * *